United States Patent
Liang et al.

(10) Patent No.: US 8,258,830 B2
(45) Date of Patent: Sep. 4, 2012

(54) METHODS FOR CALIBRATING GATED OSCILLATOR AND OSCILLATOR CIRCUIT UTILIZING THE SAME

(75) Inventors: Che-Fu Liang, Taipei County (TW); Sy-Chyuan Hwu, Taipei (TW); Yu-Hsuan Tu, Tainan (TW)

(73) Assignee: Mediatek Inc., Hsin-Chu (TW)

( * ) Notice: Subject to any disclaimer, the term of this patent is extended or adjusted under 35 U.S.C. 154(b) by 83 days.

(21) Appl. No.: 12/512,247

(22) Filed: Jul. 30, 2009

(65) Prior Publication Data

US 2010/0182056 A1 Jul. 22, 2010

Related U.S. Application Data

(60) Provisional application No. 61/145,765, filed on Jan. 20, 2009.

(51) Int. Cl.
*H03L 7/06* (2006.01)
(52) U.S. Cl. ............... 327/155; 331/44; 331/57
(58) Field of Classification Search ............ 327/155; 331/44, 57
See application file for complete search history.

(56) References Cited

U.S. PATENT DOCUMENTS

| | | | |
|---|---|---|---|
| 4,635,280 A | 1/1987 | Smith et al. | |
| 5,164,966 A | 11/1992 | Hershberger | |
| 5,815,043 A * | 9/1998 | Chow et al. | 331/57 |
| 6,928,128 B1 | 8/2005 | Sidiropoulos | |
| 2004/0046596 A1 | 3/2004 | Kaeriyama et al. | |
| 2007/0159938 A1 | 7/2007 | Sugawara et al. | |
| 2008/0001677 A1 * | 1/2008 | Shaked et al. | 331/44 |
| 2008/0169853 A1 | 7/2008 | Park et al. | |

FOREIGN PATENT DOCUMENTS

WO WO 2007/072731 6/2007

OTHER PUBLICATIONS

"A 2.5 Gb/s Run-Length-Tolerant Burst-Mode CDR Based on a 1/8th-Rate Dual Pulse Ring Oscillator" Sander L. J. Gierkink; IEEE Journal of Solid-State Circuits, vol. 43, No. 8, Aug. 2008.
"10-Gb/s Inductorless CDRs With Digital Frequency Calibration" Che-Fu Liang et al.; IEEE Transactions on Circuits and Systems—I: Regular Papers, vol. 55, No. 9, Oct. 2008.
"A 10.3125Gb/s Burst-Mode CDR Circuit Using a ΔΣ DAC" Jun Terada et al.; ISSCC 2008 / Session 11 / Optical Communication / 11.4; 2008 IEEE International Solid-State Circuits Conference.
English language translation of abstract of WO 2007/072731 (published Jun. 28, 2007).

* cited by examiner

*Primary Examiner* — John Poos
(74) *Attorney, Agent, or Firm* — Thomas|Kayden

(57) ABSTRACT

An oscillator circuit is provided. The oscillator circuit includes a gated oscillator and a calibration circuit. The gated oscillator is arranged to generate an oscillator signal according to a control signal, and receive a gating signal to align an edge of the oscillator signal with an edge of the gating signal. The calibration circuit coupled to the gated oscillator is arranged to receive a first clock signal and a second clock signal, detect an alignment operation of the gated oscillator according to the first clock signal and a second clock signal and generate the control signal according to the detected alignment operation.

29 Claims, 8 Drawing Sheets

METHODS FOR CALIBRATING GATED OSCILLATOR AND OSCILLATOR CIRCUIT UTILIZING THE SAME

CROSS REFERENCE TO RELATED APPLICATIONS

This application claims the benefit of U.S. Provisional Application No. 61/145,765 filed Jan. 20, 2009 and entitled "A Reference-Free, Digital Background Calibration Technique for Gated-Oscillator-Based CDR/PLL". The entire contents of which are hereby incorporated by reference.

BACKGROUND OF THE INVENTION

1. Field of the Invention

The invention relates to a calibration technique for a gated oscillator, and more particularly to a background calibration technique for a gated oscillator.

2. Description of the Related Art

Because gated oscillators can perform instantaneous phase realignment to input signals, they have recently grown in demand. Applications of gated oscillators include Burst Mode Clock and Data Recovery (BMCDR), low noise clock generation . . . etc. A burst mode CDR circuit is a circuit or circuit element that synchronizes or recovers timing information from a burst of formatted data applied to or input to the CDR circuit. However, one drawback of the gated oscillators is that the inherent frequency offset between the gated oscillators and input signals results in BER degradation or unwanted spurs. Conventionally, a Phase Locked Loop (PLL) with a replica gated oscillator can be used to track on-chip Process, Voltage and Temperature (PVT) variations. However, the approach requires additional circuit area for the replica, and a mismatch between the gated oscillator and the replica unavoidably occurs.

In another conventional approach, a local reference frequency is included to calibrate the frequency offset between the gated oscillators and input signals. However, the mismatch between the local reference clock and the input data rate still exits, which means a high-precision local clock source that would greatly increase the circuit cost is required. Therefore, an efficient background calibration technique is highly required.

BRIEF SUMMARY OF THE INVENTION

Oscillator circuits and methods for calibrating a frequency offset of a gated oscillator are provided. An embodiment of an oscillator circuit comprises a gated oscillator and a calibration circuit. The gated oscillator is arranged to generate an oscillator signal according to a control signal, and receive a gating signal to align an edge of the oscillator signal with an edge of the gating signal. The calibration circuit is coupled to the gated oscillator and arranged to receive a first clock signal and a second clock signal, detect an alignment operation of the gated oscillator according to the first clock signal and a second clock signal and generate the control signal according to the detected alignment operation.

Another embodiment of an oscillator circuit comprises a gated oscillator and a calibration circuit. The gated oscillator is arranged to generate an oscillator signal according to a control signal. The calibration circuit is coupled to the gated oscillator and arranged to receive a first clock signal and a second clock signal, detect a frequency or period change of the oscillator signal according to the first and the second clock signals, and generate the control signal according to the detected change. At least one of the first and the second clock signals is derived from the oscillator signal, and the second clock signal is a delayed version of the first clock signal.

An embodiment of a method for calibrating a gated oscillator is provided, comprising: detecting an alignment operation of the gated oscillator according to a plurality of phases of an oscillator signal generated by the gated oscillator; and generating a control signal to adjust the gated oscillator according to the detected alignment operation.

Another embodiment of a method for calibrating a gated oscillator is provided, comprising: generating an oscillator signal according to a control signal; receiving a first clock signal and a second clock signal and detecting a frequency or period change of the oscillator signal according to the first and the second clock signals; and generating the control signal according to the detected change. At least one of the first and the second clock signals is derived from the oscillator signal, and the second clock signal is a delayed version of the first clock signal.

Another embodiment of an oscillator circuit comprises a gated oscillator and a calibration circuit. The gated oscillator is arranged to operate according to a control signal. The calibration circuit is coupled to the gated oscillator, arranged to receive a first clock signal and a second clock signal from the gated oscillator, and generate the control signal according to the first and the second clock signals.

Another embodiment of an oscillator circuit comprises a gated oscillator and a calibration circuit. The gated oscillator is arranged to operate according to a control signal. The calibration circuit is coupled to the gated oscillator, arranged to receive a first clock signal from the gated oscillator and a second clock signal that is a delay version of the first clock signal, and generate the control signal according to the first and the second clock signals.

Another embodiment of a method for calibrating a gated oscillator is provided, comprising: controlling operation of a gated oscillator according to a control signal; and receiving a first clock signal and a second clock signal from the gated oscillator, and generate the control signal according to the first and the second clock signals.

Another embodiment of a method for calibrating a gated oscillator is provided, comprising: controlling operation of a gated oscillator according to a control signal; and receiving a first clock signal from the gated oscillator and a second clock signal that is a delay version of the first clock signal, and generate the control signal according to the first and the second clock signals.

By calibrating the gated oscillator, the frequency offset between the natural resonant frequency of the gated oscillator and the received input data can be reduced or eliminated, thereby improving the BER and jitter performance. Compared to the conventional calibration techniques, the replica oscillator and the local reference clock are not necessarily required in the present calibration mechanism. A reduced circuit area and production cost can be obtained with higher precision.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
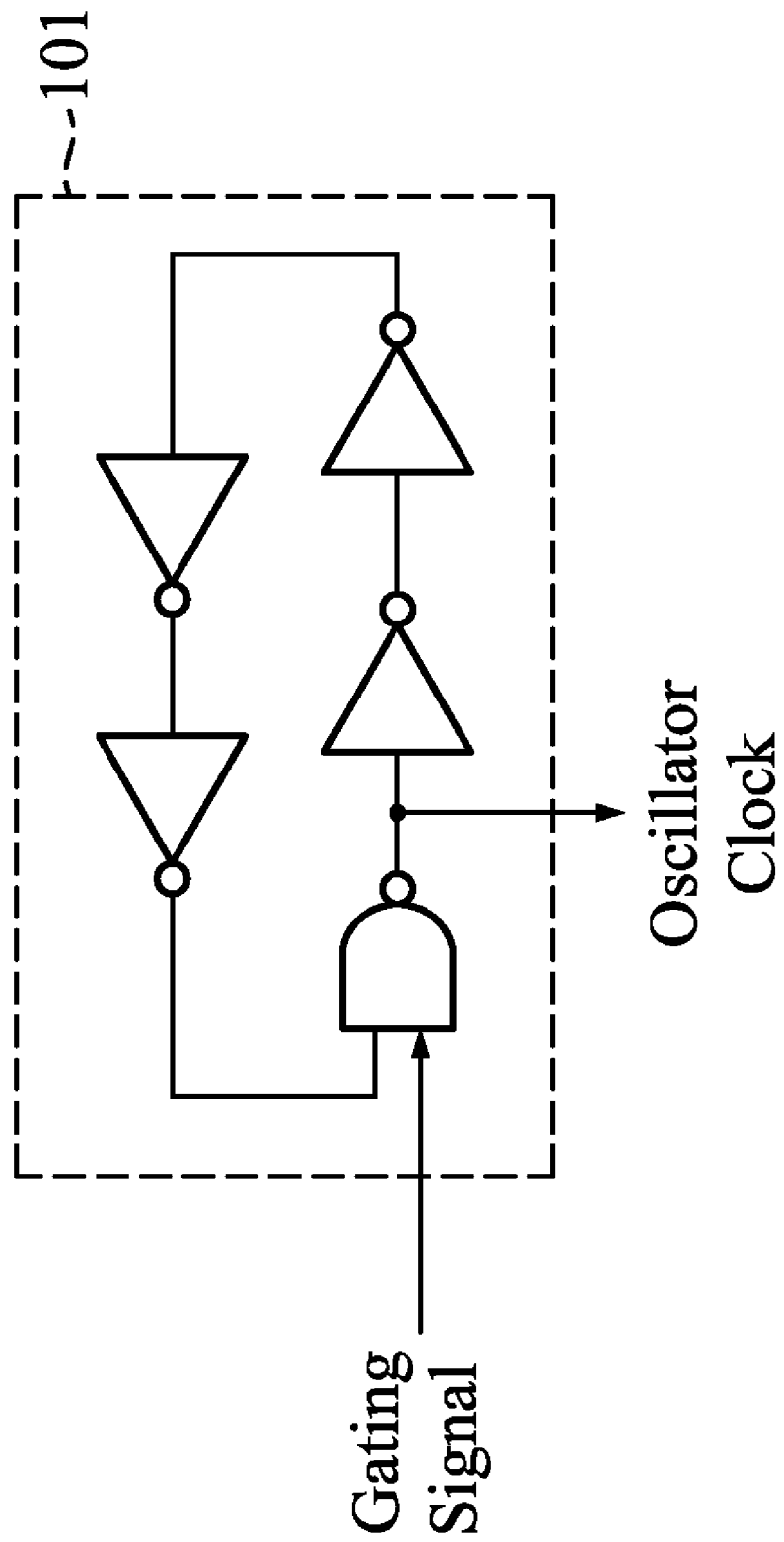
FIG. 1A shows a schematic diagram of a gated oscillator.
Figure 1B:
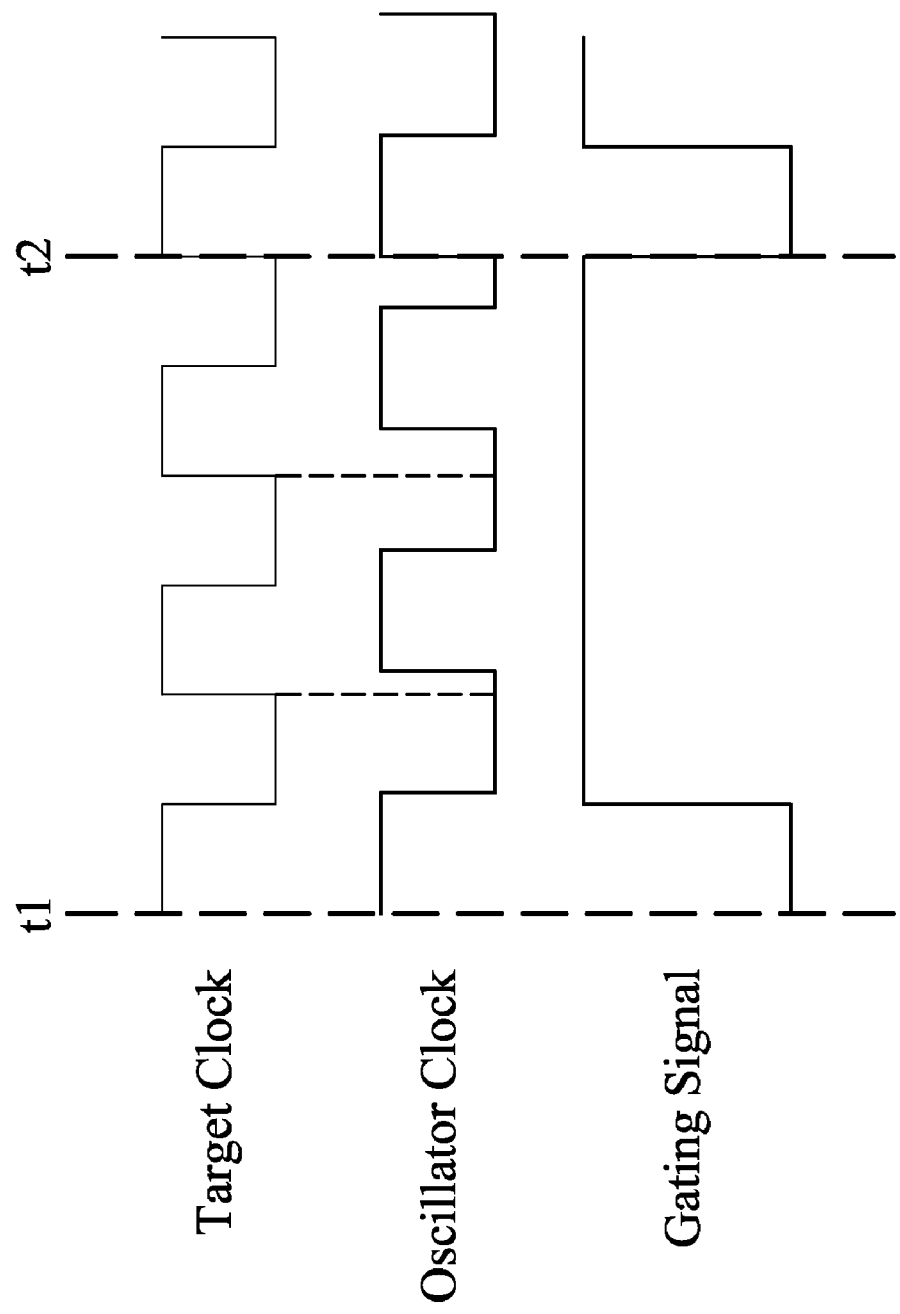
FIG. 1B shows the timing diagrams of a target clock signal with a target frequency, an oscillator clock signal and the gating signal according to an embodiment of the invention.
Figure 2:
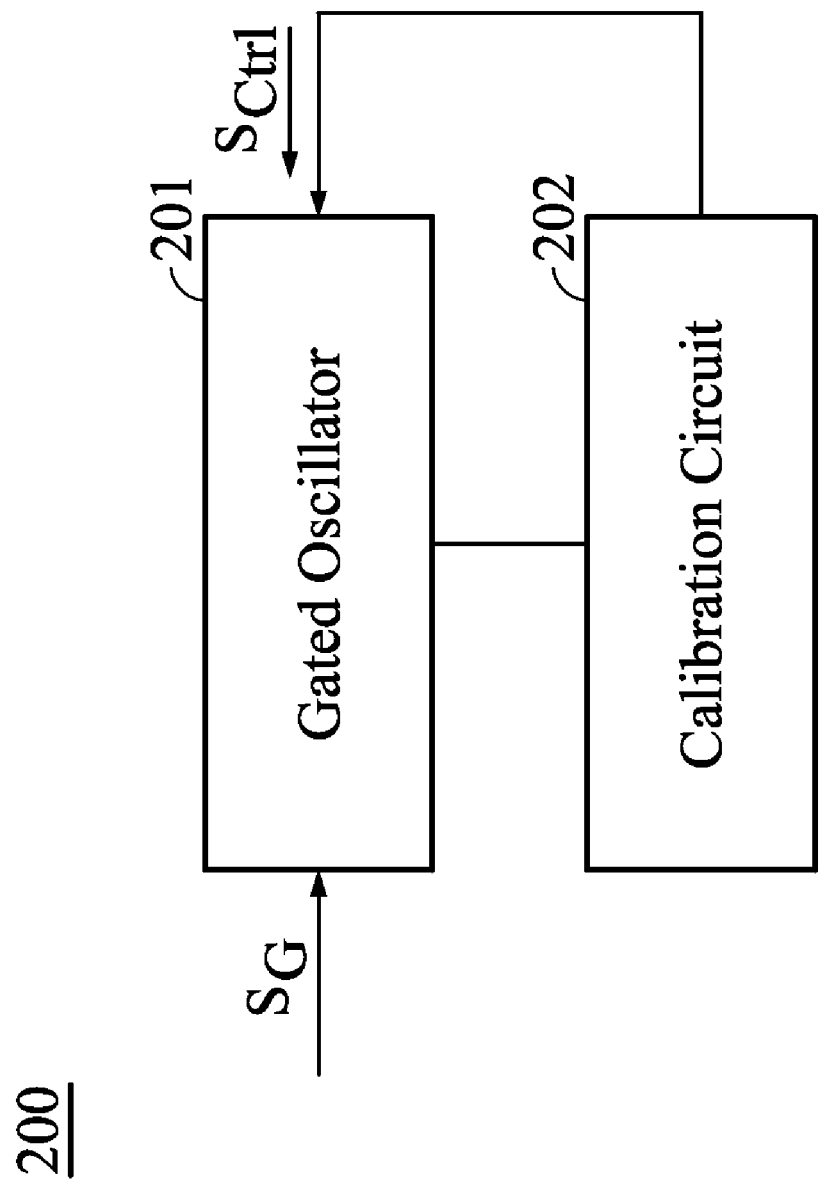
FIG. 2 shows a schematic diagram of an oscillator circuit according to an embodiment of the invention.

FIG. 1A shows a schematic diagram of a gated oscillator 101 and FIG. 1B shows the timing diagrams of a target clock signal with a target frequency, an oscillator clock signal and a gating signal according to an embodiment of the invention. As shown in FIG. 1B, an oscillator has a resonant frequency (or free-run frequency) that is not exactly the same with the target frequency. To make the average frequency of the oscillator clock be close to the target frequency, a gating signal whose waveform corresponds to the target clock signal is used. When the pulse of the gating signal is input into the oscillator at time instance t1, it forces the oscillator clock signal to be aligned with the gating signal (for example, aligning an edge of the oscillator clock signal with an edge of the gating signal). However, the oscillator clock signal may gradually deviate due to the inherent frequency offset between the free-run frequency of the oscillator and the target frequency, which causes the clock edges of the oscillator clock signal to deviate from the clock edges of the target clock signal. In order to correct the frequency deviation, another pulse of the gating signal is input into the oscillator at time instance t2 to re-align the oscillator clock signal with the gating signal, keeping the average frequency of the oscillator clock signal equal to the target frequency. Such kind of the oscillator is called a gated oscillator. The gating signal may be generated whenever there is a data transition. However, the alignment operation causes output jitter and deteriorates the bit error rate (BER). To enhance the performance, FIG. 2 shows a schematic diagram of an oscillator circuit that may reduce the effect resulting from the alignment operation according to an embodiment of the invention.

The oscillator circuit 200 comprises a gated oscillator 201 and a calibration circuit 202. According to the embodiments of the invention, the gated oscillator 201 may be a gated voltage controlled oscillator (GVCO), a gated current controlled oscillator (GICO), a gated digital controlled oscillator (GDCO) . . . etc. The gated oscillator 201 generates an oscillator signal at a resonant frequency, wherein the resonant frequency is adjustable according to a control signal $S_{ctrl}$. The gated oscillator 201 further receives a gating signal $S_G$ to align an edge of the oscillator signal with an edge of the gating signal. The calibration circuit 202 detects the behavior of the gated oscillator 201 or the oscillator clock signal, and determines if the resonant frequency of the gated oscillator 201 needs to be adjusted. For example, if an alignment operation occurs or a transient change on the period/frequency of the oscillator clock signal occurs, the calibration circuit 202 generates the control signal $S_{ctrl}$ so as to decrease the frequency offset between the resonant frequency and the target frequency (generally, the target frequency corresponds to a multiple of the input data rate or input data frequency). When the frequency offset becomes smaller, the disturbance on the oscillator clock signal caused by the alignment operation becomes slighter, and therefore the output jitter performance can be improved.

Figure 3:
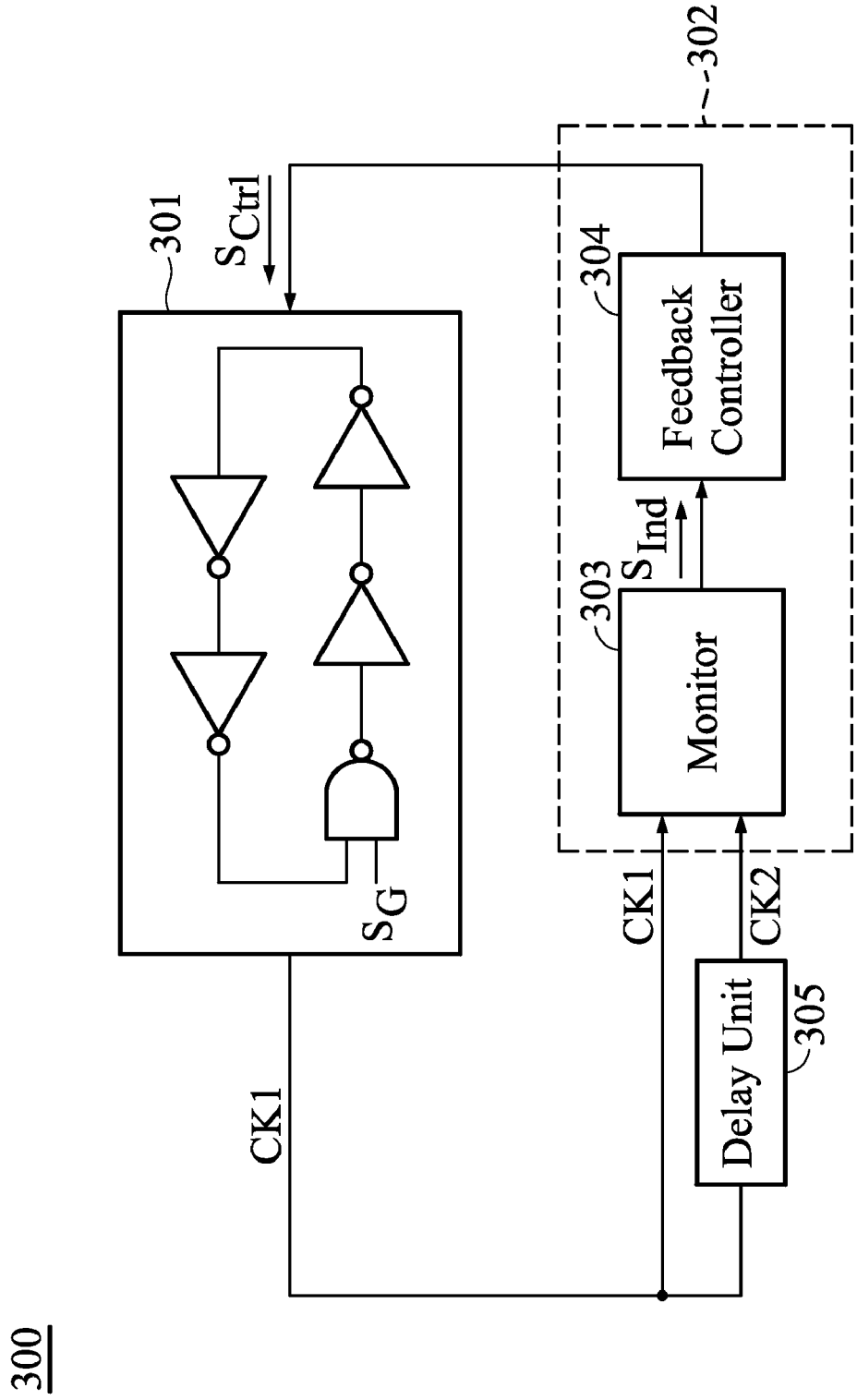
FIG. 3 shows a block diagram of an oscillator circuit according to an embodiment of the invention.

According to one embodiment of the invention, the calibration circuit 202 detects the alignment operation or the transient change on the period/frequency of the oscillator clock signal according to the phase(s) of the oscillator signal. Reference is now made to FIG. 3, which shows a block diagram of an oscillator circuit according to an embodiment of the invention. The calibration circuit 302 comprises a monitor 303 (which may be implemented by a time-to-digital converter or a phase detector) and a feedback controller 304. The monitor 303 receives a first clock signal CK1 and a second clock signal CK2. According to an embodiment of the invention, the first clock signal CK1 is derived from the gated oscillator 301, and the second clock signal CK2 is a delayed version of the first clock signal CK1. For example, the first clock signal CK1 may be an output signal from an output node of the gated oscillator 301, or a signal generated by modifying or processing an output signal from an output node of the gated oscillator 301. The second clock signal CK2 may be an output signal of the delay unit 305 that receives the first clock signal CK1. The delay unit 305 may be implemented by a delay cell, a delay line, or any other circuit capable of producing a delay. The monitor 303 detects the phases of the two clock signals CK1 and CK2 or phase difference between the two clock signals CK1 and CK2, and generates an indication signal $S_{ind}$ according to the detected result. The detected result indicates a positive or negative frequency offset between the gated oscillator and the input data (i.e., whether the resonant frequency of the gated oscillator is higher or lower than the target frequency), and the indication signal $S_{ind}$ accordingly adjusts the resonant frequency. Alternatively, the monitor 303 may samples the first clock signal CK1 according to the second clock signal CK2 or samples the second clock signal CK2 according to the first clock signal CK1 to detect a positive or negative frequency offset between the gated oscillator and the input data, and generate the indication signal $S_{ind}$ accordingly. Detailed explanations will be described in the later paragraph. The feedback controller 304 receives the indication signal $S_{ind}$ and generates the control signal $S_{ctrl}$ according to the indication signal. The gated oscillator 301 further tunes its resonant frequency, for example, through tuning the varactors on each oscillating nodes, according to the feedback control signal $S_{ctrl}$ so as to calibrate the frequency offset. It should be noted that although the gated oscillator 301 shown in FIG. 3 is a NAND-type gated voltage controlled oscillator, the invention should not be limited thereto. As one of ordinary skill in the art will readily appreciate, the gated oscillator 301 may be any type of gated oscillator performing substantially the same function or achieving substantially the same result as described in the embodiments of the invention. When the gated oscillator 301 is voltage-controlled, the control signal is in a voltage form; when the gated oscillator 301 is current-controlled, the control signal is in a current form; when the gated oscillator is digitally-controlled, the control signal is in a digital form. Moreover, although in this embodiment the feedback controller 304 converts the indication signal $S_{ind}$ of the monitor 303 into control signal $S_{ctrl}$, in other embodiments, the feedback controller 304 may be omitted if the indication signal $S_{Ind}$ can be directly utilized as the control signal $S_{ctrl}$, or the feedback controller 304 may be integrated in the gated oscillator 301.

Figure 6A:
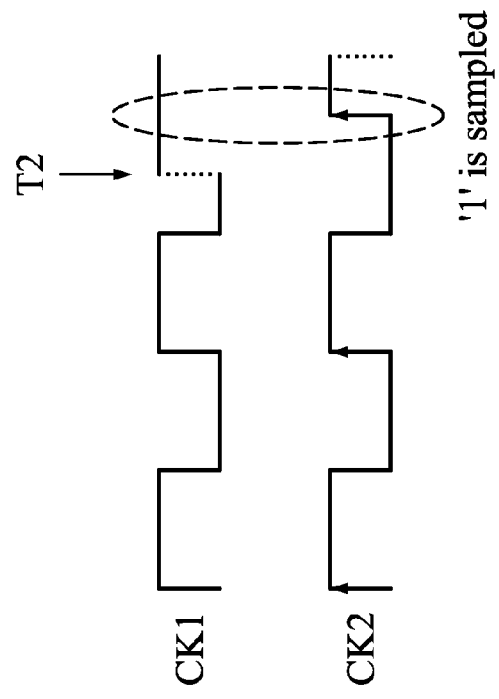
FIG. 6A and FIG. 6B show the transient waveforms of the clock signals CK1 and CK2 according to an embodiment of the invention.
Figure 6B:
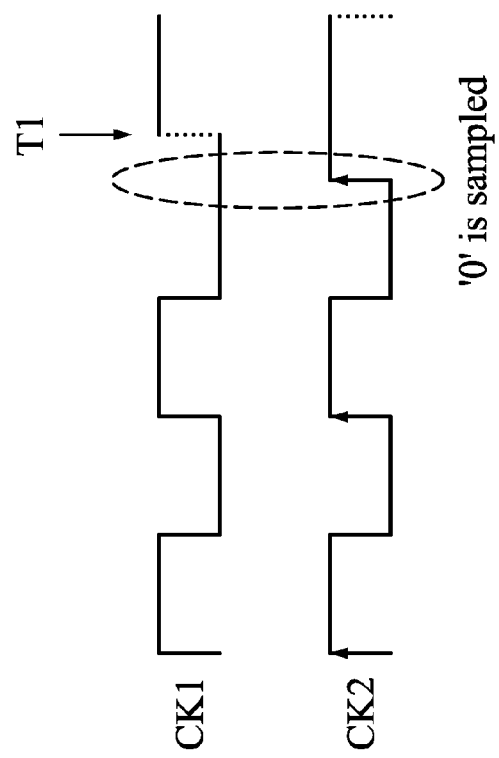

Please refer to FIGS. 6A and 6B, which show an example of how the monitor 303 detects the alignment operation according to the first and second clock signals CK1 and CK2. As shown in the figures, the first clock signal CK1 is sampled according to the second clock signal CK2. Since there is a predetermined delay (time difference) between the clock signals CK1 and CK2 (in this embodiment, the predetermined delay is 180°), an alignment operation that causes an edge to shift its position will be first observed on the first clock signal CK1 and then be observed on the second clock signal CK2 after the predetermined timing delay. Therefore, there will be a time period in which the first clock signal CK1 has already been realigned but the second clock signal CK2 is not realigned yet. When the monitor 303 detects that a currently sampled value of CK1 is different from an expected value such as a previous sampled value, the monitor 303 generates the indication signal according to transition of the sampled values to adjust the resonant frequency. For example, in FIG. 6A, an alignment operation occurs at the time instance T1, and the edge of the first clock signal CK1 is lagged. A value '0' is sampled by the monitor 303, meaning that the resonant frequency of the gated oscillator is faster than the target frequency, the monitor 303 generates the indication signal so as to decrease the resonant frequency. On the other hand, as shown in FIG. 6B, if an alignment operation occurring at the time instance T2 leads the edge of the first clock signal CK1, a value '1' will be sampled. The monitor 303 generates the indication signal so as to increase the resonant frequency. A slight sampling offset can be assigned to avoid metastability.

According to another embodiment of the invention, an alignment operation of the gated oscillator 301 may also be detected according to the variation of the phase difference between the first clock signal CK1 with respect to the second clock signal CK2. Since there is a predetermined phase difference between the clock signals CK1 and CK2, the alignment operation of the gated oscillator 301 may be detected when a current phase difference between the first and the second clock signals has deviated from the predetermined phase difference. As an example, assuming that the predetermined phase difference between CK1 and CK2 is 180°. When the monitor 503 detects an additional phase lead of the first clock signal with respect to the second clock signal, as an example, the current phase difference becomes 120°, the monitor 503 generates the indication signal $S_{Ind}$ so as to increase the resonant frequency. On the other hand, when the monitor 503 detects an additional phase lag of the first clock signal with respect to the second clock signal, as an example, the current phase difference becomes 240°, the monitor generates the indication signal $S_{Ind}$ so as to decrease the resonant frequency.

Figure 4:
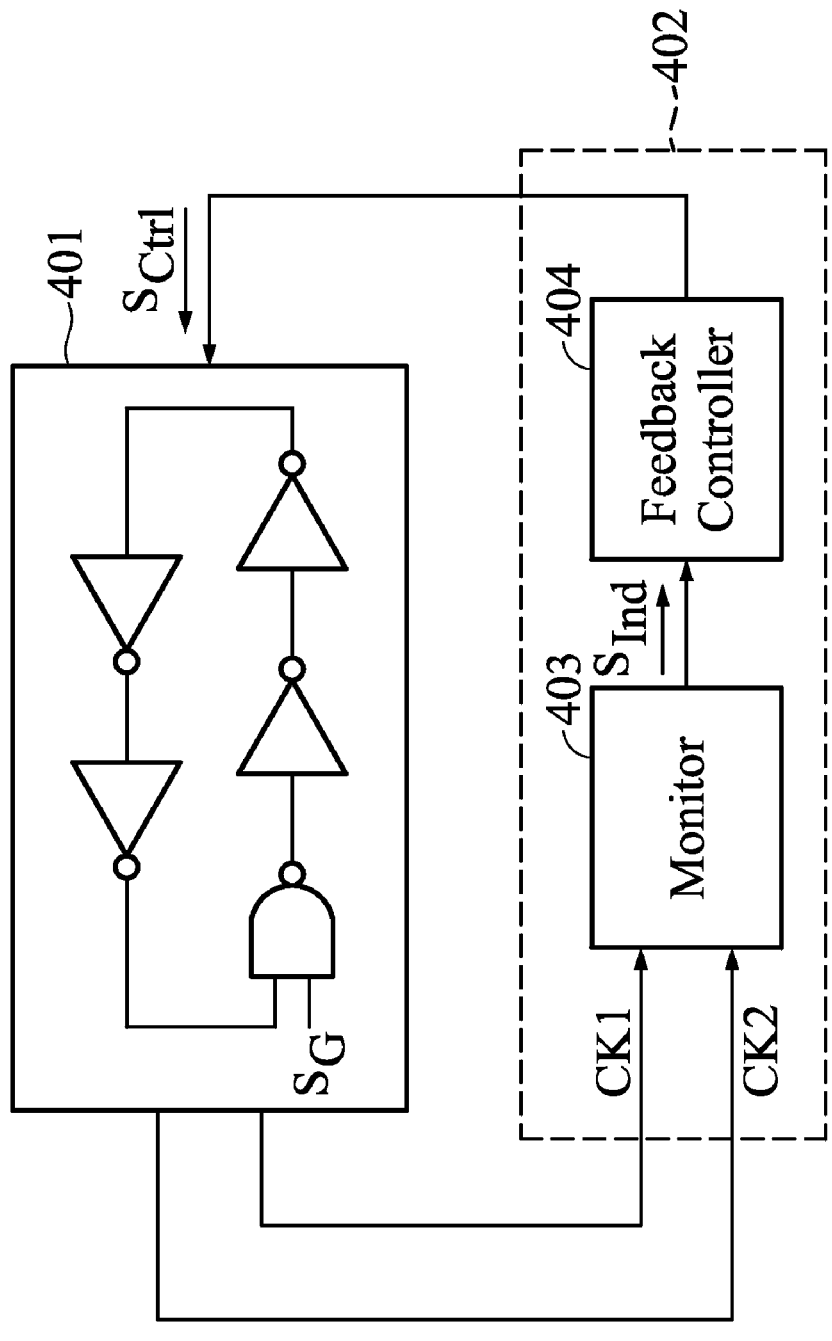
FIG. 4 shows a block diagram of an oscillator circuit according to another embodiment of the invention.

FIG. 4 shows a block diagram of an oscillator circuit according to another embodiment of the invention. According to the embodiment of the invention, the calibration circuit 402 comprises a monitor 403 and a feedback controller 404. The monitor 403 receives a first clock signal CK1 and a second clock signal CK2. Compared to the embodiment shown in FIG. 3, the first clock signal CK1 and the second clock signal CK2 are derived from two different nodes of the gated oscillator 401 in this embodiment, and the second clock signal CK2 is a delayed version of the first clock signal CK1. The delay between the two clock signals CK1 and CK2 is generated by inherent delay in the gated oscillator 401. For example, the first clock signal CK1 and the second clock signal CK2 may be output signals from output nodes of the gated oscillator 301, or signals generated by modifying or processing output signals from output nodes of the gated oscillator 301, while a predetermined time difference exists between the first and second clock signals CK1 and CK2. The monitor 403 detects the phases of or phase difference between the first and the second clock signals CK1 and CK2, and generates an indication signal $S_{Ind}$ according to the detected result. The feedback controller 404 receives the indication signal $S_{Ind}$ and generates the control signal $S_{ctrl}$ according to the indication signal. The gated oscillator 401 further tunes its resonant frequency, for example, through tuning the varactors on each oscillating nodes, according to the feedback control signal $S_{ctrl}$ so as to calibrate the frequency offset. It should be noted that although the gated oscillator 401 shown in FIG. 4 is a gated voltage controlled oscillator, the invention should not be limited thereto. As one of ordinary skill in the art will readily appreciate, the gated oscillator 401 may be any type of gated oscillator performing substantially the same function or achieving substantially the same result as described in the embodiments of the invention. Similarly, the feedback controller 404 may be omitted if the indication signal $S_{Ind}$ can be directly utilized as the control signal $S_{ctrl}$, or may be integrated into the gated oscillator 401.

Figure 5:
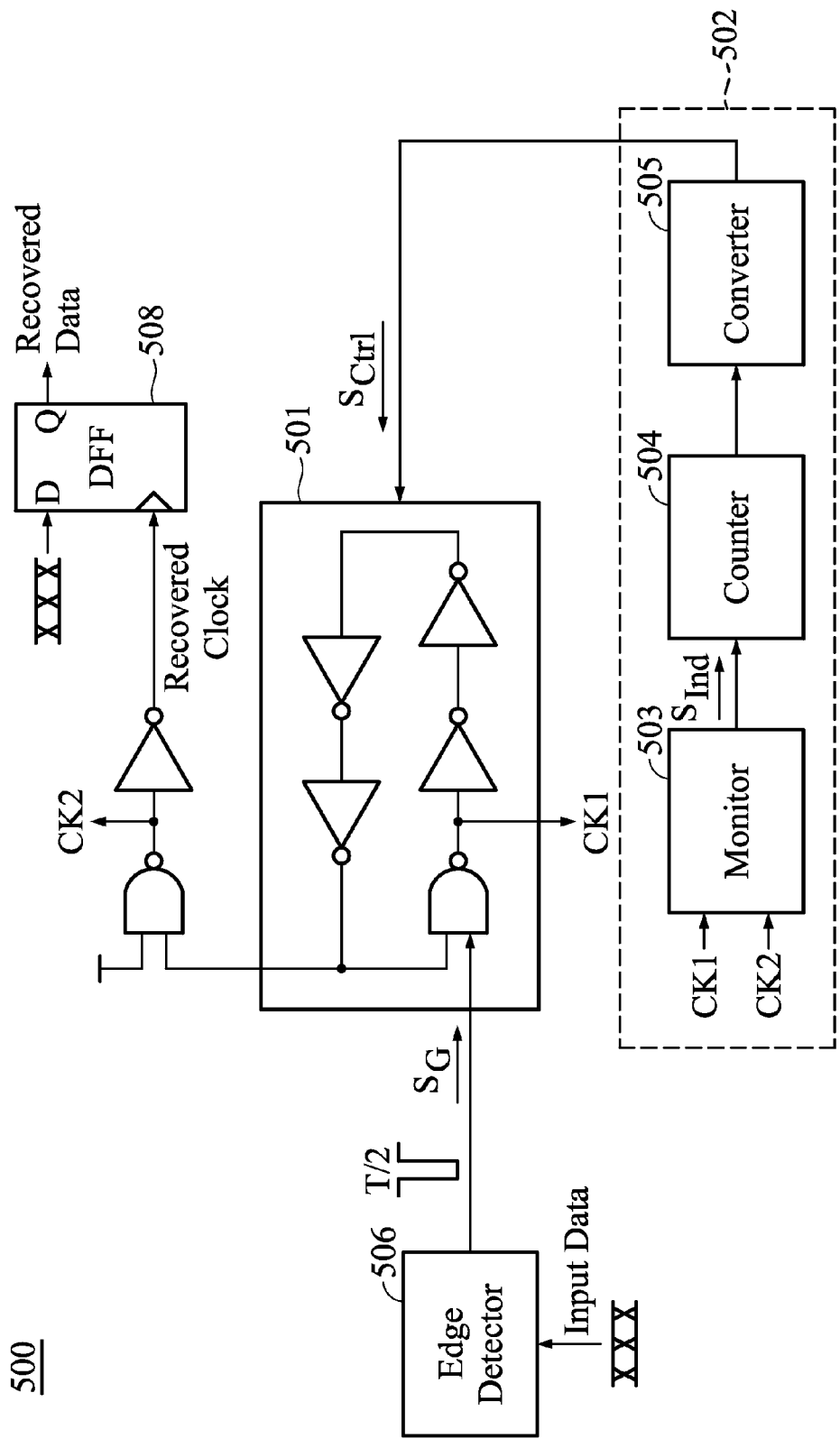
FIG. 5 shows a schematic diagram of a burst mode clock and data recovery circuit with the proposed calibration technique according to an embodiment of the invention.

FIG. 5 shows a schematic diagram of a burst mode clock and data recovery (BMCDR) circuit with the proposed calibration technique according to an embodiment of the invention. The BMCDR 500 comprises a gated oscillator 501 with an edge detector 506 to instantaneously align the edges of the gated oscillator 501 with the edges of the input data. The edge detector 506 generates a pulse of T/2 whenever there is a data transition, where T corresponds to one bit period. The DFF 508 receives the recovered clock from the gated oscillator 501 and recovers data from the input data according to the recovered clock. According to the embodiment of the invention, the calibration circuit 502 may comprise a monitor 503, a counter 504 and a converter 505. The monitor 503 receives two clock signals CK1 and CK2 from two different nodes of the gated oscillator 501, wherein the second clock signal CK2 is a delayed version of the first clock signal CK1. As an example, the predetermined delay between two clock signals CK1 and CK2 may be 180°. It should be noted that the second clock signal CK2 may also be obtained from a delay unit as shown in FIG. 3 and the invention should not be limited thereto. It should also be noted that although the gated oscillator 501 shown in FIG. 5 is a gated voltage controlled oscillator, the invention should not be limited thereto.

According to an embodiment of the invention, the monitor 503 samples the first clock signal CK1 according to the second clock signal CK2 and/or samples the second clock signal CK2 according to the first clock signal CK1 so as to detect the alignment operation. As an example, the phase alignment/realignment occurs at the node outputting the first clock signal CK1 every data transition with one gate delay. The phase alignment/realignment then occurs at the node outputting the second clock signal CK2 with a delay of T/2. The monitor 503 generates an indication signal $S_{Ind}$ according to the detected alignment operation. The counter 504 and the converter 505 together provide substantially the same functionality with the above-mentioned feedback controller. For example, the indication signal $S_{Ind}$ may contain a digital number varying corresponding to the detected alignment operation. The digital number may be '1' or '0' when a positive or negative alignment operation is detected. The counter 504 maintains a count value, and the converter 505 converts the count value into control signal $S_{Ctrl}$ so as to adjust the resonant frequency of the gated oscillator 501. In one embodiment, the converter 505 is implemented by a digital-to-analog converter (DAC)

for converting the digital count value into an analog control voltage or control current. In this way, the frequency offset between the gated oscillator and the input data rate is reduced, thereby reducing the BER or output jitter of the BMCDR 500. The BMCDR 500 could be designed without using local reference clock or replica oscillator, and could be background calibrated. Moreover, when the input data shown in FIG. 5 is replaced by a periodical switching signal (that is, the edge detector 506 generates the gating signal $S_G$ according to the periodical switching signal), the circuit 500 can be utilized as a clock generator.

Figure 7:
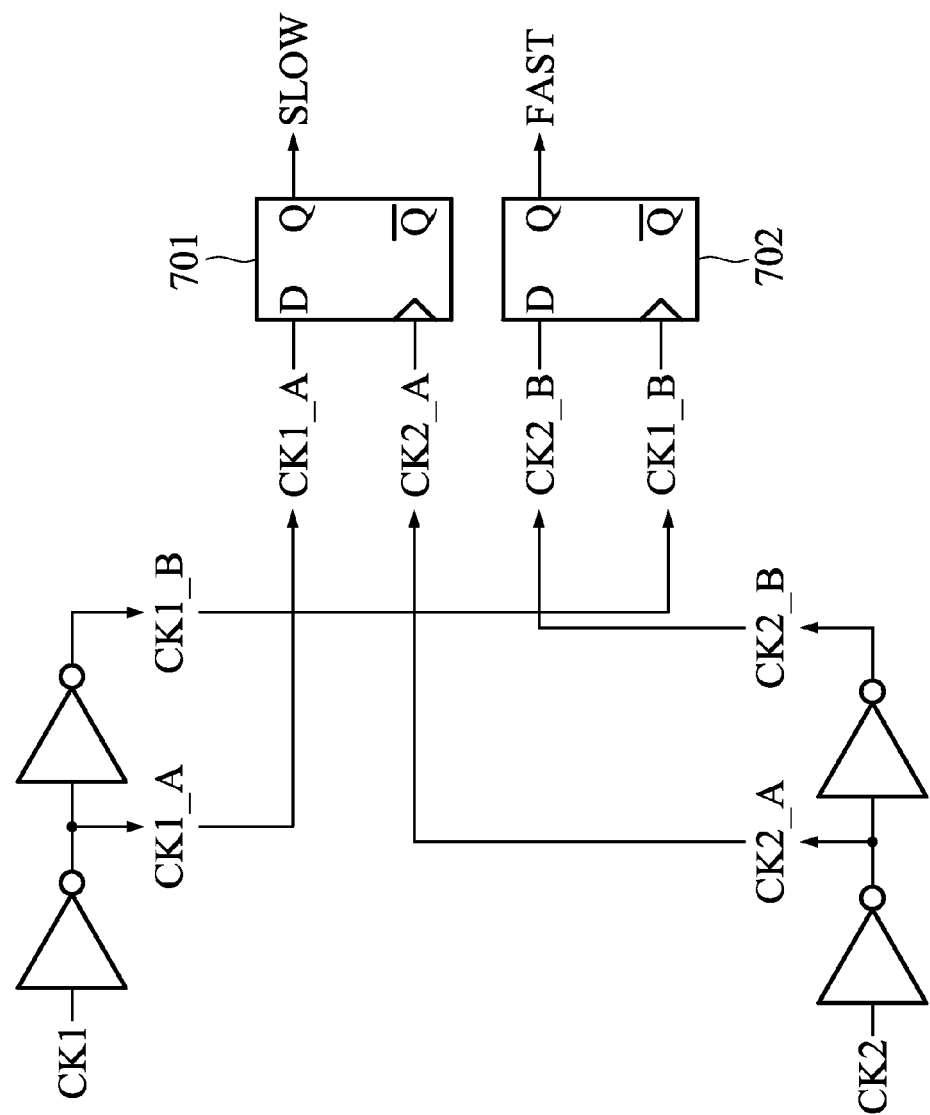
FIG. 7 shows a schematic diagram of a phase realignment detector according to an embodiment of the invention.

According to the embodiments of the invention, the monitor may be a phase detector, such as a phase realignment detector, a bang-bang phase detector, or any type of monitor performing substantially the same function or achieving substantially the same result as the monitor described in the embodiments of the invention. It should be noted that when the monitor is capable of detecting the amount of the phase difference/frequency offset rather than determining the polarity (such as positive or negative) of the phase difference/frequency offset, the counter may be omitted. FIG. 7 shows a schematic diagram of an exemplary phase realignment detector according to an embodiment of the invention. The phase realignment detector 700 may comprise two sets of D flip-flop (DFF) 701 and 702. The DFF 701 is clocked by the clock signal CK2_A and samples the clock signal CK1_A, wherein the clock signals CK1_A and CK2_A are the inverted versions of the clock signals CK1 and CK2, respectively. The DFF 701 is introduced to detect whether the rate (resonant frequency) of the oscillator signal is slower than the input data rate. On the other hand, the DFF 702 is clocked by the clock signal CK1_B and samples the clock signal CK2_B, wherein the clock signals CK1_B and CK2_B are the inverted versions of the clock signals CK1_A and CK2_A, respectively. The DFF 702 is introduced to detect whether the rate (resonant frequency) of the oscillator signal is faster than the input data rate. It is noted that according to an embodiment of the invention, a slight sampling offset may be assigned for sampling DFFs in the phase realignment detector 700 to avoid metastability problems and the invention should not be limited thereto.

According to the embodiments of the invention, a background calibration technique for the gated oscillator is proposed. This approach reduces or eliminates the frequency offset between the gated oscillator and the input data/reference clock to reduce the bit error rate or output jitter. It demonstrates an error-free operation for a $(2^{31}-1)$ Pseudo Random Binary Sequence (PRBS) and tolerates more than 253 consecutive identical digits (CIDs).

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An oscillator circuit, comprising:
   a gated oscillator arranged to generate an oscillator signal according to a control signal, wherein the gated oscillator further receives a gating signal to align an edge of the oscillator signal with an edge of the gating signal; and
   a calibration circuit coupled to the gated oscillator, arranged to receive a first clock signal and a second clock signal, detect an alignment operation of the gated oscillator according to the first clock signal and a second clock signal by sampling the first clock signal according to the second clock signal, and generate the control signal according to the detected alignment operation.

2. The oscillator circuit as claimed in claim 1, wherein the calibration circuit comprises:
   a monitor arranged to receive the first clock signal and the second clock signal, detect the alignment operation according to the first and the second clock signals, and generate an indication signal according to the detected alignment operation; and
   a feedback controller arranged to receive the indication signal and generate the control signal according to the indication signal.

3. The oscillator circuit as claimed in claim 1, wherein the calibration circuit further samples the second clock signal according to the first clock signal.

4. The oscillator circuit as claimed in claim 1, wherein when a sampled value is different from an expected value, the calibration circuit generates the control signal.

5. The oscillator circuit as claimed in claim 1, wherein the second clock signal is a delayed version of the first clock signal.

6. The oscillator circuit as claimed in claim 5, wherein the second clock signal is generated through at least one delay unit by delaying the first clock signal.

7. The oscillator circuit as claimed in claim 5, wherein the second clock signal is generated by delaying the first clock signal through inherent delay in the gated oscillator.

8. The oscillator circuit as claimed in claim 5, wherein the first and the second clock signals have a predetermined phase difference, and the calibration circuit generates the control signal to adjust a resonant frequency of the gated oscillator when detecting that a current phase difference between the first and the second clock signals has deviated from the predetermined phase difference.

9. The oscillator circuit as claimed in claim 1, wherein at least one of the first and the second clock signals is derived from the gated oscillator.

10. The oscillator circuit as claimed in claim 1, wherein the first and the second clock signals are derived from two different nodes of the gated oscillator.

11. An oscillator circuit, comprising:
    a gated oscillator arranged to generate an oscillator signal according to a control signal; and
    a calibration circuit coupled to the gated oscillator, arranged to receive a first clock signal and a second clock signal, detect a frequency or period change of the oscillator signal according to the first and the second clock signals, and generate the control signal according to the detected change, wherein at least one of the first and the second clock signals is derived from the oscillator signal, and the second clock signal is a delayed version of the first clock signal.

12. The oscillator circuit as claimed in claim 11, wherein the calibration circuit detects the change by sampling the first clock signal according to the second clock signal or by sampling the second clock signal according to the first clock signal.

13. The oscillator circuit as claimed in claim 11, wherein the second clock signal is generated through at least one delay unit by delaying the first clock signal according to a predetermined time difference.

14. The oscillator circuit as claimed in claim 11, wherein the second clock signal is generated by delaying the first clock signal through inherent delay in the gated oscillator.

15. The oscillator circuit as claimed in claim 11, wherein when the calibration circuit detects an occurrence of an additional phase lead of the first clock signal with respect to the second clock signal, the calibration circuit generates the control signal so as to increase the resonant frequency, and wherein when the calibration circuit detects an occurrence of an additional phase lag of the first clock signal with respect to the second clock signal, the calibration circuit generates the control signal so as to decrease the resonant frequency.

16. The oscillator circuit as claimed in claim 11, wherein the calibration circuit comprises:
a monitor arranged to detect the change of the oscillator signal according to the first and the second clock signals, and generate an indication signal according to the detected change;
a counter arranged to receive the indication signal and accordingly maintain a count value; and
a converter arranged to convert the count value to the control signal.

17. A method for calibrating a gated oscillator, comprising:
detecting an alignment operation of the gated oscillator according to a plurality of phases of an oscillator signal generated by the gated oscillator;
generating a control signal to adjust the gated oscillator according to the detected alignment operation;
receiving a first clock signal and a second clock signal, wherein the second clock signal is a delayed version of the first clock signal;
sampling the first clock signal according to the second clock signal;
detecting whether a sampled value of the first clock signal is different from an expected value; and
generating the control signal according to the detected result.

18. A method for calibrating a gated oscillator, comprising:
detecting an alignment operation of the gated oscillator according to a plurality of phases of an oscillator signal generated by the gated oscillator;
generating a control signal to adjust the gated oscillator according to the detected alignment operation;
receiving a first clock signal and a second clock signal, wherein the second clock signal is a delayed version of the first clock signal;
sampling the second clock signal according to the first clock signal;
detecting whether a sampled value of the second clock signal is different from an expected value; and
generating the control signal according to the detected result.

19. A method for calibrating a gated oscillator, comprising:
generating an oscillator signal according to a control signal;
receiving a first clock signal and a second clock signal, and detecting a frequency or period change of the oscillator signal according to the first and the second clock signals; and
generating the control signal according to the detected change;
wherein at least one of the first and the second clock signals is derived from the oscillator signal, and the second clock signal is a delayed version of the first clock signal.

20. An oscillator circuit, comprising:
a gated oscillator arranged to operate according to a control signal; and
a calibration circuit coupled to the gated oscillator, arranged to receive a first clock signal and a second clock signal from the gated oscillator, and generate the control signal according to the first and the second clock signals.

21. An oscillator circuit, comprising:
a gated oscillator arranged to operate according to a control signal; and
a calibration circuit coupled to the gated oscillator, arranged to receive a first clock signal from the gated oscillator and a second clock signal that is a delay version of the first clock signal, and generate the control signal according to the first and the second clock signals.

22. The oscillator circuit as claimed in claim 21, wherein the calibration circuit comprises:
a monitor arranged to receive the first clock signal and the second clock signal, detect an alignment operation according to the first and the second clock signals, and generate an indication signal according to the detected alignment operation; and
a feedback controller arranged to receive the indication signal and generate the control signal according to the indication signal.

23. The oscillator circuit as claimed in claim 21, wherein the calibration circuit detects an alignment operation by sampling the first clock signal according to the second clock signal.

24. The oscillator circuit as claimed in claim 21, wherein the second clock signal is generated through at least one delay unit by delaying the first clock signal or is generated by delaying the first clock signal through inherent delay in the gated oscillator.

25. The oscillator circuit as claimed in claim 21, wherein the first and the second clock signals have a predetermined phase difference, and the calibration circuit generates the control signal to adjust a resonant frequency of the gated oscillator when detecting that a current phase difference between the first and the second clock signals has deviated from the predetermined phase difference.

26. A method for calibrating a gated oscillator, comprising:
controlling operation of a gated oscillator according to a control signal; and
receiving a first clock signal and a second clock signal from the gated oscillator, and generate the control signal according to the first and the second clock signals.

27. A method for calibrating a gated oscillator, comprising:
controlling operation of a gated oscillator according to a control signal; and
receiving a first clock signal from the gated oscillator and a second clock signal that is a delay version of the first clock signal, and generate the control signal according to the first and the second clock signals.

28. The method as claimed in claim 27, wherein the second clock signal is a delayed version of the first clock signal, the method further comprising:
sampling the first clock signal according to the second clock signal;
detecting whether a sampled value of the first clock signal is different from an expected value; and
generating the control signal according to the detected result.

29. The method as claimed in claim 27, wherein the second clock signal is a delayed version of the first clock signal, the method further comprising:
sampling the second clock signal according to the first clock signal;
detecting whether a sampled value of the second clock signal is different from an expected value; and
generating the control signal according to the detected result.

* * * * *